United States Patent

[11] 3,607,467

[72] Inventor King Lau Hu
Torrance, Calif.

[21] Appl. No. 829,509
[22] Filed June 2, 1969
[45] Patented Sept. 21, 1971
[73] Assignee TRW Semiconductors Inc.
Los Angeles, Calif.

[54] METHOD FOR FABRICATING AN ALLOYED SEMICONDUCTOR DEVICE

10 Claims, 1 Drawing Fig.

[52] U.S. Cl. .......... 148/181, 148/33.3, 148/185
[51] Int. Cl. .......... H01l 7/46
[50] Field of Search .......... 148/177, 178, 179, 180, 181, 182, 185, 1.5, 33.3; 117/200, 201, 212, 213, 229

[56] References Cited

UNITED STATES PATENTS

| | | | |
|---|---|---|---|
| 3,323,956 | 6/1967 | Gee | 148/177 |
| 3,464,867 | 9/1969 | Queen | 148/181 |

*Primary Examiner*—Richard O. Dean
*Attorney*—Spensley, Horn and Lubitz

ABSTRACT: An improved method for the fabrication of an alloyed semiconductor device. A silicon crystal of a first type conductivity is provided. A region of a metal for producing a second type conductivity is alloyed into a portion of the silicon crystal establishing a PN junction. Prior to heating the crystal to establish the desired device characteristics, a layer of oxide is disposed upon the surface of the crystal whereon the junction is exposed. Upon heating, the oxide combines with the passivating layer on the silicon crystal forming a glass encapsulating member which will prevent the crystal from cracking when the device is cooled by quenching.

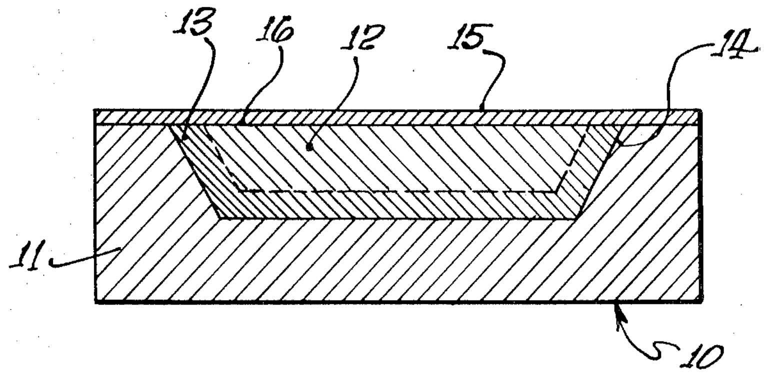
INVENTOR.
KING LAU HU,
BY HIS ATTORNEYS
Spensley & Horn

METHOD FOR FABRICATING AN ALLOYED SEMICONDUCTOR DEVICE

BACKGROUND OF THE INVENTION

1. Field of the Invention

The present invention relates generally to the field of processes for the fabrication of semiconductor devices, and specifically to the fabrication of alloyed devices.

2. Prior Art

The fabrication of alloyed semiconductor devices is one of the oldest methods known in the semiconductor art. The problems raised by the prior art techniques and ones which have not been solved relate to the use of materials having coefficients of thermal expansion which are significantly different.

A method disclosed by the prior art for the fabrication of low voltage avalanche devices illustrate the heretofore unresolved problems. A silicon crystal of N-type conductivity is provided. A portion of a P-type producing material, preferable aluminum, was alloyed into the crystal. The alloyed material will produce a zone of material having P-type conductivity, therefore, a rectifying PN junction is established. To develop the precise reverse characteristics needed for an avalanche voltage device, the crystal was heated to a specific temperature and for a time sufficient to form a regrowth region and establish those characteristics after which the device was cooled by quenching. The problem inherent in this method was the low yield of devices. During the quenching step, the silicon crystal would tend to crack in the region of the junction.

Cracking of the silicon crystal occurred because of the differences in the magnitudes of the coefficients of thermal expansion of the silicon and the alloyed metal. When the alloyed device was cooled by quenching, the metal would dimensionally contract to a greater degree than the silicon. The contraction of the metal would cause extreme stresses to be created in the region of the junction of the metal and the silicon. The stress created would crack the silicon in many of the devices.

The present invention solves this problem by utilizing an oxide layer prior to the reheating of the device. After the silicon crystal and alloyed metal are cooled slowly, a layer of an oxide is disposed upon the surface of the device whereon the junction is exposed. The oxide, after combining the silicon oxide layer on the silicon crystal surface upon reheating, will counter the thermal stress created during quenching. By counteracting the effects of thermal stress, cracking of the silicon crystal can be prevented.

SUMMARY OF THE INVENTION

It is an object of the present invention to provide an alloyed semiconductor device which will withstand the effect of thermal stress.

It is another object of the present invention to provide a method of fabricating an alloyed semiconductor device which will substantially increase the yield of operable devices.

It is yet another object of the present invention to provide a method of fabricating an alloyed semiconductor device which will diminish the cracking of the semiconductor material during the manufacturing process.

It is still another object of the present invention to provide an improved method for fabricating low voltage avalanche semiconductor devices.

The prior art discloses methods for the manufacture of avalanche alloyed diodes, but the problem of low yields has persisted. The present invention provides an improved method to fabricate the devices whereby the yields have been substantially increased.

A semiconductor wafer is provided, the material preferably being silicon of N-type conductivity. A PN junction is established in the silicon wafer by alloying a P-type producing material into a portion of the N-type silicon wafer. A typical P-type producing material is aluminum. After the aluminum is melted into the silicon wafer and cooled slowly, an oxide is disposed upon the surface of the silicon wafer where the boundaries of the established PN junction are exposed. The oxide is one which will, upon heating, combine with the silicon oxide layer to form a glass layer which has a coefficient of thermal expansion approximately equal to that of silicon. A typical oxide which can be used is phosphorous pentoxide. In the fabrication of an avalanche alloy device, the device must be heated to a precise temperature for a sufficient time to form a regrowth region and thereby develop the electrical characteristic of the device, after which the device is cooled by quenching. The glass layer will compensate for the stresses created by the severe temperature changes during the quenching procedure. Since the thermal stress created by the contracting aluminum cannot be fully applied to the region of the junction, cracking of the silicon wafer will be prevented.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

BRIEF DESCRIPTION OF THE DRAWING

The drawing illustrates a sectional view of a semiconductor device fabricated in accordance with the present invention.

DESCRIPTION OF THE PREFERRED EMBODIMENT

The present invention method can be best understood by reference to the drawing. A semiconductor device is indicated generally by the reference number 10. The semiconductor device 10 can be any alloyed semiconductor device. The specific device is not a part of the present invention. For the purpose of example only, a low voltage avalanche alloyed device, or Zener diode, shall be considered.

The basic member of the semiconductor device 10 is the semiconductor wafer 11, preferably being silicon. To provide a first doped region, the silicon wafer 11 is processed in accordance with known techniques to establish the conductivity characteristic of the silicon wafer 11. The silicon wafer 11 is preferably of N-type conductivity. If the silicon wafer 11 is of N-type conductivity, the next step in the present invention method is to melt a portion of P-type producing material into the silicon wafer 11. When using silicon, a preferable P-type producing material is aluminum. A portion of aluminum is disposed upon the surface of the silicon wafer 11 and raised to a temperature sufficient to melt the aluminum into the silicon wafer 11. Typically, the semiconductor device 10 is subjected to a temperature of approximately 720° C. for approximately 3 minutes. The semiconductor device is then cooled for a time sufficiently long to prevent the creation of excessive thermal stress in the region of the junction 14.

Although a PN junction 14 is formed, a low voltage avalanche device requires precise electrical characteristics. The prior art discloses methods to fabricate alloyed devices, but they suffer from low yield problems. The prior art discloses that after the semiconductor device 10 was heated to the proper temperature to form regrowth region 13 and thereby develop the desired electrical characteristics, the semiconductor device 10 was cooled by quenching. The severe temperature change caused the silicon wafer 11 to crack in the region of the junction 14. The region 14 comprises silicon of P-type conductivity and the region 12 comprises the remainder of the alloyed aluminum.

In the fabrication of a Zener diode, the reverse electrical characteristics can be imparted to the device only by precise controls over the manufacturing process. The silicon wafer 11 and the alloyed aluminum must be subjected to a proper high temperature environment for a sufficient period of time to develop the characteristics of the specific device being fabricated. The temperatures and times are elements of known techniques and are not parts of the present invention. The temperature to which the silicon wafer 11 is to be raised is typically in the range of 800° C. to 1,100° C. After remaining at this temperature for the requisite length of time, the device is cooled by quenching.

The prior art disclosed no method which could prevent many alloyed devices from being damaged during the quenching operation. The damage occurred due to the difference in the coefficient of thermal expansion of silicon as compared to that of the P-type producing material, i.e., aluminum. As an example, the aluminum has a coefficient of linear thermal expansion of approximately $0.224 \times 10^{4}$ and silicon has a coefficient of linear thermal expansion of approximately $0.0763 \times 10^{4}$. The thermal contraction characteristics of the materials are reflected in the difference between the magnitudes of the coefficients. When the silicon wafer 11 is cooled from the temperature at which the Zener characteristics are established, the severe temperature change caused by quenching results in a rate of contraction of the aluminum which is greater than that of the silicon. The results of the processes disclosed by prior art is a product yield of approximately 10 percent. The silicon wafer 11 would crack approximately in the region of the junction 14 with the resulting loss of the device.

The present invention method substantially increases the yield of operable devices. After the aluminum is melted into the silicon wafer 11 and slowly cooled, an oxide layer 15 is disposed upon the surface 16 of the silicon wafer 11 whereon the junction 14 is exposed. The oxide can be any material which, when heated in the presence of silicon, will form a glass layer which has a coefficient of thermal expansion approximately the same as silicon. A typical oxide which meets these requirements is phosphorous pentoxide. The manner in which the phosphorous pentoxide is applied to the surface 16 can be by conventional techniques. Typically, the phosphorous pentoxide is dissolved in alcohol to facilitate application, and an oxide layer 15 is then applied to the surface 16 of silicon wafer 11.

After the oxide layer 15 of phosphorous pentoxide has been applied to the surface 16 of the silicon wafer 11, the semiconductor device 10 is reheated to the temperature required to develop the desired electrical characteristics. During the reheating, the phosphorous pentoxide will react with the silicon oxide layer to form a glass member, the glass having a coefficient of thermal expansion approximately the same as the silicon. When the semiconductor device 10 is quenched, the glass will compensate for the stress created by the contracting aluminum thereby retarding the heretofore high cracking rate of the semiconductor device 10. The present invention method has increased the yield of low voltage avalanche alloyed devices from approximately 10 percent to approximately 60 percent.

I claim:

1. An improved method for the fabrication of a semiconductor device manufactured by the steps of alloying a PN junction in a semiconductor wafer, reheating the alloyed semiconductor wafer to establish a regrowth region and quenching the alloyed semiconductor wafer, the improvement comprising the intermediate step of disposing a thermal stress compensating oxide upon the alloyed semiconductor wafer adjacent the alloyed PN junction prior to the manufacturing step of reheating.

2. An improved method for the fabrication of a semiconductor device as defined in claim 1 wherein said semiconductor wafer is silicon of N-type conductivity.

3. An improved method for the fabrication of a semiconductor device as defined in claim 2 wherein the regrowth region is aluminum doped silicon.

4. An improved method for the fabrication of a semiconductor device as defined in claim 1 wherein said thermal stress compensating oxide has a coefficient of linear thermal expansion substantially the same as silicon.

5. An improved method for the fabrication of a semiconductor device as defined in claim 4 wherein said thermal stress compensating oxide is phosphorus pentoxide.

6. An improved method for the manufacture of alloyed semiconductor devices fabricated by the steps of providing a semiconductor wafer of a first type conductivity, alloying into the semiconductor wafer an impurity of a second type conductivity different from the first type conductivity forming a partially exposed PN junction in the semiconductor wafer, reheating the alloyed semiconductor wafer to form a suitable regrowth region and quenching the semiconductor device, the improvement comprising the intermediate fabrication step of disposing upon the exposed PN junction a glass forming oxide having a coefficient of linear thermal expansion substantially the same as silicon before the semiconductor wafer is reheated.

7. An improved method as defined in claim 6 wherein said semiconductor wafer is silicon of N-type conductivity.

8. An improved method as defined in claim 7 wherein said alloyed impurity is aluminum.

9. An improved method as defined in claim 6 wherein said glass forming oxide is phosphorus pentoxide.

10. An improved method for fabricating alloyed silicon devices fabricated by the conventional steps of providing a semiconductor wafer of a first type conductivity having a surface, alloying into the surface of the semiconductor wafer an impurity of a second type conductivity different from the first type conductivity forming an alloyed PN junction in the semiconductor wafer with a portion thereof exposed at the surface of the semiconductor wafer, reheating the alloyed semiconductor wafer to form a suitable regrowth region to establish the electrical characteristics thereof, and cooling the semiconductor device by quenching, the improvement comprising the intermediate step of disposing upon the PN junction exposed on the surface of the semiconductor wafer a layer of phosphorus pentoxide before the alloyed semiconductor wafer is reheated to form the regrowth region.